United States Patent [19]

Magome et al.

[11] Patent Number: 4,678,934

[45] Date of Patent: Jul. 7, 1987

[54] FLIP-FLOP CIRCUIT

[75] Inventors: Koichi Magome; Haruki Toda; Hiroyuki Koinuma, all of Yokohama; Hiroshi Sahara, Tokyo; Kiminobu Suzuki, Yokohama; Shigeo Ohshima; Kenji Komatsu, both of Tokyo, all of Japan

[73] Assignee: Kabushiki Kaisha Toshiba, Kawasaki, Japan

[21] Appl. No.: 884,629

[22] Filed: Jul. 11, 1986

[30] Foreign Application Priority Data

Jul. 16, 1985 [JP] Japan .................................. 60-156513

[51] Int. Cl.$^4$ ..................... H03K 3/26; H03K 17/687; H03K 19/094; G11C 7/00
[52] U.S. Cl. .................................. 307/279; 307/482; 307/578; 365/203; 365/205
[58] Field of Search .............. 307/279, 292, 530, 482, 307/578, 355; 365/190, 203, 205

[56] References Cited

U.S. PATENT DOCUMENTS

| | | | |
|---|---|---|---|
| 4,508,980 | 4/1985 | Puar ..................................... | 365/203 |
| 4,542,306 | 9/1985 | Ikeda .................................... | 307/279 |
| 4,542,310 | 9/1985 | Ellis et al. ............................ | 307/578 |
| 4,547,685 | 10/1985 | Wong .................................... | 307/530 |

Primary Examiner—Stanley D. Miller
Assistant Examiner—Trong Quang Phan
Attorney, Agent, or Firm—Finnegan, Henderson, Farabow, Garrett & Dunner

[57] ABSTRACT

A flip-flop circuit has a power terminal set at 5 V, first and second output terminals, a latch section for charging one of the first and second terminals to 5 V and discharging the other one of the first and second terminals to 0 V in accordance with an input signal, a first MOS transistor having a current path connected between the power and first output terminals, a second MOS transistor for charging the gate of the first MOS transistor while the potential of the second output terminal is changed from 5 V to 0 V, and a capacitor for bootstrapping the gate potential of the first MOS transistor to turn on the first MOS transistor. The flip-flop circuit further includes a third MOS transistor, having a current path connected between the gate of the first MOS transistor and the first output terminal and a gate connected to the first output terminal, for charging the gate of the first MOS transistor when the gate potential of the first MOS transistor is dropped a predetermined level in comparison with that of the first output terminal.

16 Claims, 9 Drawing Figures

FLIP-FLOP CIRCUIT

BACKGROUND OF THE INVENTION

The present invention relates to a flip-flop circuit for, e.g., constituting a counter.

It is well known that a dynamic RAM requires refreshing of storage data. FIG. 1 partially shows a refresh control circuit of a dynamic RAM. The memory cells of the dynamic RAM are arranged in a matrix on a semiconductor chip, and constitute memory cell array 10 shown in FIG. 1. The rows of array 10 are selected by row decoder 12. In the refresh mode, the content of the memory cells in the selected row is updated to new data having the same logic value as that of old data. The refresh control circuit has address counter 14, which causes decoder 12 to sequentially designate row addresses of array 10. Address counter 14 comprises series-connected register stages 14-1 to 14-N. The output terminals of register stages 14-1 to 14-N are parallel-connected to row decoder 12 to supply a refresh address signal thereto. Enable signal EN shown in FIG. 1 is supplied to register stages 14-1 to 14-N in the refresh mode. Clock signals $\phi0$ and $\bar{\phi}0$ have a complementary relationship therebetween, and are supplied to register stage 14-1. For example, register stage 14-1 generates output signal $\phi1$ shown in FIG. 2B in response to the trailing edge of clock signal $\phi0$ shown in FIG. 2A. Register stage 14-2 generates output signal $\phi2$ shown in FIG. 2C in response to the trailing edge of clock signal $\phi1$ shown in FIG. 2B. More specifically, a refresh address is incremented each time the logic values of clock signals $\phi0$ and $\bar{\phi}0$ are inverted. Register stages 14-1, 14-2, ... must hold the logic values of output signals $\phi1$, $\bar{\phi}1$; $\phi2$, $\bar{\phi}2$ ... while the logic values of input signals $\phi0$, $\bar{\phi}0$; $\phi1$, $\bar{\phi}1$ ... are not changed and while enable signal EN is not supplied.

Conventionally, each of register stages 14-1 to 14-N has a flip-flop circuit like that shown in FIG. 3 or 4. In the flip-flop circuits shown in FIGS. 3 and 4, the potential of a VDD level (e.g., 5 V) or a VSS level (e.g., 0 V) is set at input terminal IN or $\overline{IN}$ in accordance with signals $\phi0$ and $\bar{\phi}0$. Note that the potentials of input terminals IN and $\overline{IN}$ have a complementary relationship therebetween, such that when the potential of one terminal changes from the VDD to VSS level, the potential of the other terminal changes from the VSS to VDD level. Enable signal EN is selectively supplied to control terminal CT. The potential of control terminal CT is set at a first level equal to or higher than a (VDD+VTH) level [e.g., the (VDD+VTH) level] when enable signal EN is supplied thereto; otherwise, terminal CT is set at a second level lower than a VTH level (e.g., the VSS level). Note that "VTH" indicates the threshold voltage of n-channel MOS transistors. In the flip-flop circuits shown in FIGS. 3 and 4, n-channel MOS transistors Q1 to Q4 charge or discharge nodes N2 and N1 in accordance with the potentials of input terminals IN and $\overline{IN}$, thereby setting one of the potentials of output terminals OUT and $\overline{OUT}$ at the VDD level and the other thereof at the VSS level. Terminal S receives a pulse signal, which periodically changes from one of the VSS and VDD levels to the other, from a pulse oscillator (not shown). N-channel MOS transistors Q5 and Q7 and MOS capacitor C1 constitute a first potential compensation circuit for compensating for the potential drop of output terminal $\overline{OUT}$ of node N1, when output terminal $\overline{OUT}$ is set at the VDD level. N-channel MOS transistors Q6 and Q8, and MOS capacitor C2 constitute a second potential compensation circuit for compensating for the potential drop of output terminal OUT of node N2, when output terminal OUT is set at the VDD level. The potential drops of output terminals OUT and $\overline{OUT}$ are caused by a drive current of the MOS transistors connected to terminals OUT and $\overline{OUT}$ as, e.g., loads.

The operation of the flip-flop circuit shown in FIG. 3 will now be described. For example, when MOS transistors Q1 and Q2 are rendered conductive and the potentials of nodes N1 and N2 are respectively set at the VSS and VDD levels, MOS transistors Q3 and Q4 are respectively rendered conductive and nonconductive. The potentials of nodes N1 and N2 are thereby held, even after MOS transistors Q1 and Q2 are turned off. MOS transistor Q8, for example, charges node N4 in response to the leading edge of the potential of the corresponding output terminal OUT. When the potential of node N4 exceeds the (VDD−VTH) level, transistor Q8 is turned off, and node N4 is left charged. The potential of node N4 increases due to its capacitive coupling each time the pulse signal at the VDD level is supplied to capacitor C2, and then exceeds the (VDD+VTH) level. Thereby, MOS transistor Q6 is rendered conductive. If the potential of output terminal OUT is decreased because of a load after it is set at the VDD level, the potential can usually be increased to the VDD level by turning on MOS transistor Q6.

When the potential of node N1 is set at the VSS level, MOS transistor Q7 is conductive. However, since node N3 is not charged by MOS transistor Q7, it cannot turn off transistor Q7. MOS transistor Q5 receives a gate voltage at the VSS level through MOS transistors Q3 and Q7, and is rendered nonconductive regardless of the pulse signal at the VDD level supplied to capacitor C1 at this time. Therefore, the potential of output terminal $\overline{OUT}$ is maintained at the VSS level.

The flip-flop circuit shown in FIG. 4 has the same arrangement as that in FIG. 3, except in that the gates of MOS transistors Q7 and Q8 are connected to nodes N2 and N1, respectively. Node N3 is charged by MOS transistor Q7 during a transient period in which the potential of node N1 is changed from the VSS to VDD level and the potential of node N2 is changed from the VDD to VSS level. MOS transistor Q7 is rendered completely nonconductive when the potential of node N2 has reached the VSS level, thus storing charges at node N3. At this time, the potential of node N3 is set at about the (VDD−VTH) level, and is further increased by the pulse signal at the VDD level. Node N4 is charged by MOS transistor Q8 during a transient period in which the potential of node N1 is changed from the VDD to VSS level and the potential of node N2 is changed from VSS to VDD level. MOS transistor Q8 is rendered completely nonconductive when the potential of node N1 has reached the VSS level, thereby storing charges at node N4. At this time, the potential of node N4 is set at about the (VDD−VTH) level, and is further increased by the pulse signal at the VDD level. Therefore, MOS transistors Q5 and Q6 are controlled in the same manner as in the flip-flop circuit shown in FIG. 3.

The flip-flop circuits shown in FIGS. 3 and 4 have the following drawbacks. The flip-flop circuit shown in FIG. 3 cannot cope with a large potential drop after the potential at the VDD level is set at one of output terminals OUT and $\overline{\text{OUT}}$. When the potential of, e.g., output terminal OUT is decreased below the (VDD−VTH) level, MOS transistor Q8 is undesirably rendered conductive, and charges are moved from node N4 to node N2 therethrough. More specifically, MOS transistor Q8 cannot charge node N4 to a level high enough to turn on MOS transistor Q6 with use of the pulse signal at the VDD level. Therefore, the potential of output terminal OUT cannot be restored at the VDD level. This also occurs when the potential of output terminal $\overline{\text{OUT}}$ is decreased below the (VDD−VTH) level.

The flip-flop circuit shown in FIG. 4 cannot cope with a decrease in charges after one of nodes N3 and N4 is charged. For example, when the amount of charge of node N4 is decreased by current leakage or the like, MOS transistor Q6 often cannot be supplied with sufficient gate voltage from node N4. MOS transistor Q8 is turned on or off in accordance with the potential of node N1, and is kept nonconductive by the gate voltage at the VSS level after charges are stored at node N4. Therefore, MOS transistor Q8 cannot charge node N4 when the potential of node N4 is decreased. When node N3 is charged in order to maintain the potential of output terminal $\overline{\text{OUT}}$ at the VDD level, MOS transistor Q7 operates in the same manner as transistor Q8.

As described above, the flip-flop circuits shown in FIGS. 3 and 4 are unsuitable for maintaining an output signal for a long period of time. In these circuits, the potentials of output terminals OUT and $\overline{\text{OUT}}$ cannot be set at specific levels immediately after a power source is turned on, and the potentials of output terminals OUT and $\overline{\text{OUT}}$ depend on the charged states of nodes N1 and N2.

SUMMARY OF THE INVENTION

It is an object of the present invention to provide a flip-flop circuit suitable for constituting a highly reliable, simple counter.

According to the present invention, there is provided a flip-flop circuit, comprising: a power terminal set at a potential of a first level, first and second output terminals, a latching section for charging one of the first and second output terminals to a potential of the first level and discharging the other one of the first and second output terminals to a potential of a second level lower than the first level, thereby latching an input signal, and a potential compensation section for compensating a potential drop of the first output terminal. Said potential compensation section including: a pull-up transistor having an insulated gate and a current path connected between the power and first output terminals, a charging circuit for charging the insulated gate while the potential of the second output terminal is changed from the first level to the second level, a bootstrap circuit for bootstrapping the potential of the insulated gate to turn on the pull-up transistor, and a diode device, connected in the forward direction from the first output terminal to the insulated gate, for charging the insulated gate when the potential of the insulated gate is dropped by at least a predetermined level in comparison with that of the first output terminal.

In the flip-flop circuit of the present invention, if the gate potential of the MOS transistor is decreased due to current leakage, the potential of the first output terminal can be reliably set at the first predetermined level.

DETAILED DESCRIPTION OF THE PREFERRED EMBODIMENT

Figure 5:
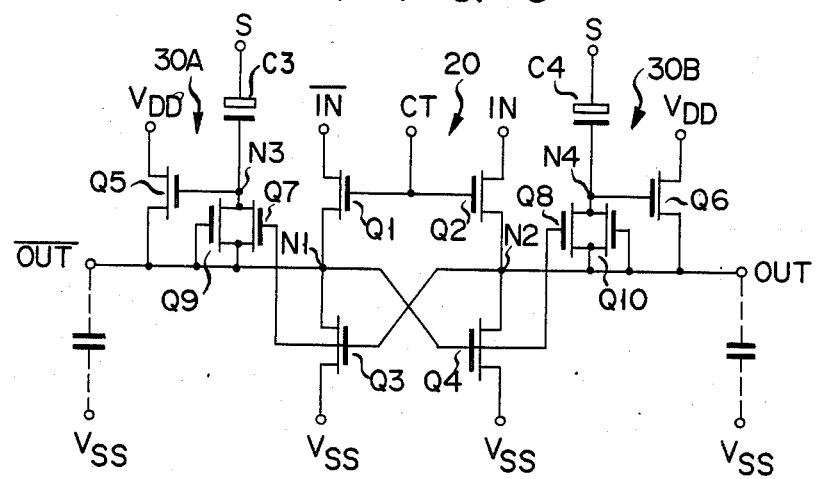
FIG. 5 is a circuit diagram of a flip-flop circuit according to an embodiment of the present invention.

An embodiment of the present invention will now be described with reference to FIG. 5. FIG. 5 shows a flip-flop circuit formed, e.g., as a part of a counter on a semiconductor chip of a dynamic RAM. The flip-flop circuit has latch section 20 for latching the potentials of input terminals IN and $\overline{\text{IN}}$ setting the latched potentials at output terminals OUT and $\overline{\text{OUT}}$ by charging or discharging. The flip-flop circuit also has first and second potential compensation sections 30A and 30B for compensating for the potential drops of output terminals OUT and $\overline{\text{OUT}}$, respectively. Latch section 20 comprises n-channel MOS transistors Q1 to Q4. First potential compensation section 30A comprises n-channel MOS transistors Q5, Q7, and Q9, and enhancement type MOS capacitor C3. Second potential compensation section 30B comprises n-channel MOS transistors Q6, Q8, Q10, and depletion type MOS capacitor C4. MOS capacitor C3 has a threshold voltage of 0.5 to 1.0 V, and MOS capacitor C4 has a threshold voltage below 0 V. Power terminals VDD and VSS shown in FIG. 5 are set at a VDD level (=5V) and a VSS level (=0V), respectively, in accordance with the amplitude of the output voltage necessary for the flip-flop circuit.

In latch section 20, the gates of MOS transistors Q1 and Q2 are connected to control terminal CT, to which enable signal EN is selectively supplied. The potential of control terminal CT is set at a first level equal to or higher than a (VDD+VTH) level (e.g., the (VDD+VTH) level) when enable signal EN is supplied; otherwise, it is set at a second level lower than a VTH level (e.g., VSS level). Note that "VTH" indicates the thereshold voltage (0.5 to 0.6 V) of an n-channel MOS transistor. One end of the current path of MOS transistor Q1 is connected to input terminal $\overline{\text{IN}}$, and the other end thereof is connected to terminal VSS through the current path of MOS transistor Q3. One end of the current path of MOS transistor Q2 is connected to input terminal IN, and the other end thereof is connected to terminal VSS through the current path of MOS transistor Q4. A junction between the current paths of MOS transistors Q2 and Q4 is connected to output terminal OUT, and is also connected to the gate of MOS transistor Q3. A junction between the current paths of MOS transistors Q1 and Q3 is connected to output terminal $\overline{\text{OUT}}$, and is also connected to the gate of MOS transistor Q4. Input terminals IN and $\overline{\text{IN}}$ receive input signals $\phi$ and $\bar{\phi}$, which have a complementary relationship, and are set at the VDD level or the VSS level. For example, when the potential of terminal IN is set at the VDD level, that of terminal $\overline{\text{IN}}$ is set at the VSS level.

In first potential compensation circuit 30A, enhancement type MOS capacitor C3 is connected between pulse input terminal S and one end of the current path of MOS transistor Q7. The other end of the current path of MOS transistor Q7 is connected to node N1 (i.e., the junction of the current paths of MOS transistors Q1 and Q3). The gate of MOS transistor Q7 is connected to node N2 (i.e., the junction of the current paths of MOS transistors Q2 and Q4). The current path of MOS transistor Q9 is parallel-connected to that of MOS transistor Q7. MOS transistor Q9 is connected at the gate to node N1 to thus serve as a diode. The gate of MOS transistor Q5 is connected to node N3 (i.e., the junction of MOS capacitor C3 and the current paths of MOS transistors Q7 and Q9). The current path of MOS transistor Q5 is connected between terminal VDD and node N1. Pulse input terminal S is connected to a pulse oscillator (not shown) formed on the same semiconductor chip as the flip-flop circuit, and periodically receives voltage pulses therefrom to bootstrap the gate potentials of MOS transistors Q5 and Q6. Thus, the potential of pulse input terminal S changes between the VDD and VSS levels.

In second potential compensation circuit 30B, depletion type MOS capacitor C4 is connected between pulse input terminal S and one end of the current path of MOS transistor Q8. The other end of the current path of MOS transistor Q8 is connected to node N2 (i.e., the junction of the current paths of MOS transistors Q2 and Q4). The gate of MOS transistor Q8 is connected to node N1 (i.e., the junction of the current paths of MOS transistor Q1 and Q3). The current path of MOS transistor Q10 is parallel-connected to the current path of MOS transistor Q8. MOS transistor Q10 is connected at the gate to node N2 to thus serve as a diode. The gate of MOS transistor Q6 is connected to node N4 (i.e., the junction of MOS capacitor C4 and the current paths of MOS transistors Q8 and Q10). The current path of MOS transistor Q6 is connected between terminal VDD and node N2.

The preset operation of the flip-flop circuit of this embodiment will now be described. Before a power source is turned on, the potentials of nodes N1, N2, N3, and N4 are normally at the VSS level. In this case, MOS transistors Q7, Q8, Q9, and Q10 are kept nonconductive. In MOS capacitors C3 and C4, the gate potential at the VSS level provides a predetermined capacitance to MOS capacitor C4, and also provides a capacitance sufficiently smaller than the predetermined capacitance to MOS capacitor C3. This is because the gate potential at the VSS level is higher than the threshold voltage of MOS capacitor C4, and is lower than that of MOS capacitor C3.

Immediately after the power source is turned on, when the potential of pulse input terminal S changes toward the VDD level, the potentials of nodes N3 and N4 are increased due to the capacitive coupling. MOS transistor Q5 is turned on when the potential of node N3 exceeds threshold voltage VTH of the n-channel MOS transistor. MOS transistor Q6 is turned on when the potential of node N4 exceeds threshold voltage VTH of the n-channel MOS transistor.

Since MOS capacitor C3 is set at the predetermined capacitance after MOS capacitor C4 is set, node N4 reaches a potential level equal to threshold voltage VTH before node N3 does. Thus, MOS transistor Q6 is turned on, and causes the potential of output terminal OUT to increase toward the VDD level. This increase in potential turns on MOS transistors Q3 and Q7, and sets the potential of output terminal $\overline{\text{OUT}}$ before MOS transistor Q5 is turned on.

Immediately after the power source is turned on, when the potential of pulse input terminal S changes toward the VSS level, the potentials of nodes N3 and N4 are decreased due to the capacitive coupling. However, when the potentials of nodes N3 and N4 are decreased to a (potential of node N1-threshold voltage VTH) level and a (potential of node N2-threshold voltage VTH) level, respectively, MOS transistors Q9 and Q10 are turned on, and charges stored at nodes N1 and N2 are supplied to nodes N3 and N4 through MOS transistors Q9 and Q10, respectively. Therefore, the potentials of nodes N3 and N4 will not be decreased below the (potential of node N1-threshold voltage VTH) level and the (potential of node N2-threshold voltage VTH) level, respectively. Note that the amount of charges supplied to nodes N3 and N4 is small, and the potential drops of nodes N1 and N2 can be ignored. After the potential of pulse input terminal S has reached the VSS level, when it inversely increases toward the VDD level, the potentials of nodes N3 and N4 are increased as described above.

After MOS transistor Q6 is turned on, the potential of node N4 gradually increases in response to each leading edge of the pulses periodically supplied to pulse input terminal S, and is saturated at a level higher than the (VDD+VTH) level. During this interval, nodes N1 and N3 are discharged by respective MOS transistors Q3 and Q7 and set at the VSS level. MOS transistor Q4 is kept completely nonconductive. Therefore, the potential of output terminal OUT can increase reliably. When the potential of node N4 reaches the (VDD+VTH) level, MOS transistor Q6 is rendered conductive in a non-saturation range and sets the potential of output terminal OUT at the VDD level.

Next, a hold operation of the output signal will be described. Latch section 20 latches the potentials of input terminals IN and $\overline{\text{IN}}$ under the potential control of control terminal CT, and sets output terminals OUT and $\overline{\text{OUT}}$ at potentials respectively equal to those of input terminals IN and $\overline{\text{IN}}$. MOS transistors Q1 and Q2 are rendered conductive in the non-saturation range when control terminal CT is set at the (VDD+VTH) level by enable signal EN. Meanwhile, when input terminals IN and $\overline{\text{IN}}$ are respectively set at one and the other of the VDD and VSS levels in accordance with input signals $\phi$ and $\overline{\phi}$, nodes N1 and N2 are charged or discharged to potentials equal to those of input terminals IN and $\overline{\text{IN}}$, respectively. MOS transistors Q3 and Q4 are then turned on or off in accordance with the potentials of nodes N2 and N1. For example, when node N1 is set at the VDD level, MOS transistor Q4 is turned on and keeps node N2 discharged. On the other hand, when node N2 is set at the VDD level, MOS transistor Q3 is turned on and keeps node N1 discharged. In this manner, one of the potentials of output terminals OUT and $\overline{\text{OUT}}$ is always set at the VDD level, and the other one is set at the VSS level. When the potential of control terminal CT is set at the VSS level, MOS transistors Q1 and Q2 are turned off. Thereafter, one of the potentials of output terminals OUT and $\overline{\text{OUT}}$ is kept at the VDD level by charges left at node N1 or N2.

MOS transistor Q7 keeps node N3 discharged when the potential of node N2 is at the VDD level, and charges node N3 while the potential of node N2 changes from the VDD to VSS level. MOS transistor Q9 is rendered conductive and then charges node N3 when the potential of node N3 is decreased below the (VDD−VTH) level after the potential of node N1 is held at the VDD level. MOS transistor Q5 is completely turned on when the potential of node N3 is set to exceed the (VDD+VTH) level by MOS capacitor C3, to which the voltage pulses are periodically supplied.

MOS transistor Q8 keeps node N4 discharged when the potential of node N1 is at the VDD level, and charges node N4 while the potential of node N1 changes from the VDD to VSS level. MOS transistor Q10 is rendered conductive and then charges node N4 when the potential of node N4 is decreased below the (VDD−VTH) level after the potential of node N2 is held at the VDD level. MOS transistor Q6 is completely turned on when the potential of node N4 is set to exceed the (VDD+VTH) level by MOS capacitor C4, to which the voltage pulses are periodically supplied thereto.

Assume that the potentials of output terminals OUT and $\overline{\text{OUT}}$ are respectively set at the VDD and VSS levels in accordance with the potentials of input terminals IN and $\overline{\text{IN}}$. In this case, charging of node N4 and discharging of node N3 have been completed by transistors Q8 and Q7, respectively. The potential of node N4 increases in response to each leading edge of the potential of terminal S and finally turns on MOS transistor Q6. Thus, the potential of output terminal OUT is forcibly held at the VDD level. MOS transistors Q8 and Q10 are in the nonconductive states in a period before MOS transistor Q6 is turned on. If the potential of output terminal OUT is decreased in this period due to, e.g., the load, charges do not migrate from node N4 to node N2 through MOS transistors Q8 and Q10. MOS transistor Q10 prevents the potential of node N4 from being decreased when the potential of terminal S falls. The potential of node N3 is not increased while MOS transistors Q3 and Q7 are rendered conductive, thus keeping MOS transistor Q5 nonconductive.

Figure 6:
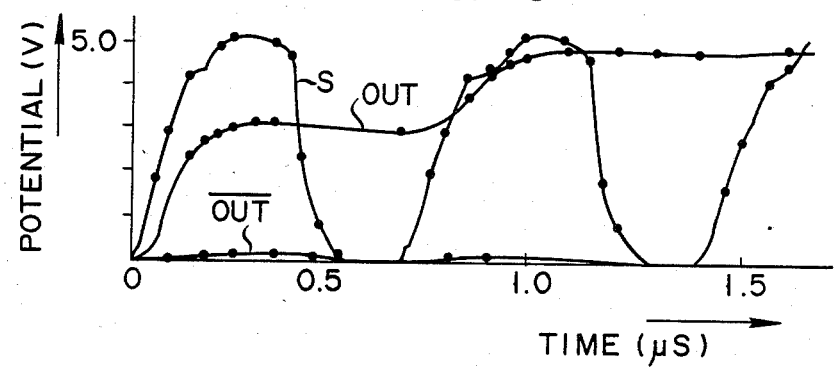
FIG. 6 is a graph showing preset operation characteristics of the circuit shown in FIG. 5.
Figure 7:
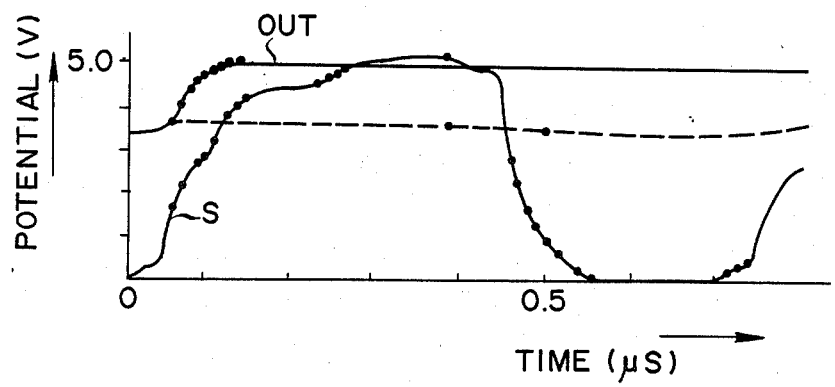
FIG. 7 is a graph showing output signal holding characteristics of the circuit shown in FIG. 5.

FIG. 6 shows preset operation characteristics of the flip-flop circuit in this embodiment, and FIG. 7 shows output voltage holding characteristics of the flip-flop circuit. As shown in FIG. 6, when the potential of input terminal S periodically changes between the VDD level (=5 V) and the VSS level (=0 V) by turning on the power source, the potential of output terminal OUT increases stepwise from 0 V, and is preset at 5 V after a lapse of about 1.0 μs. On the other hand, the potential of output terminal $\overline{\text{OUT}}$ is preset to 0 V.

Figure 1:
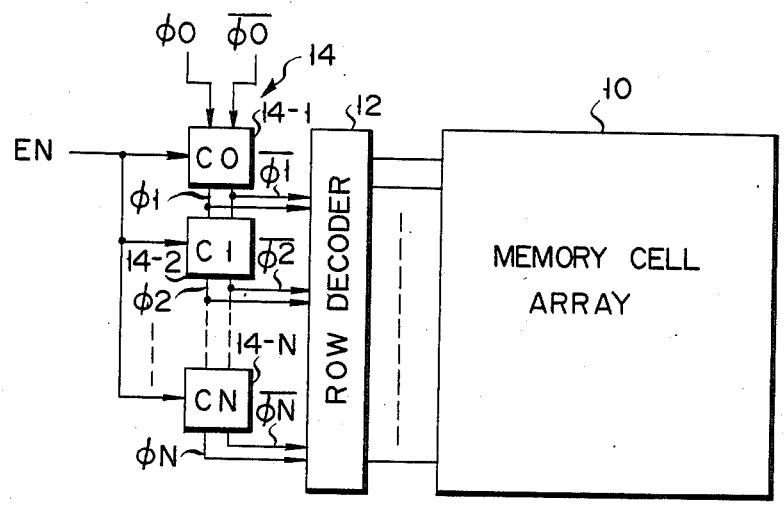
FIG. 1 is a circuit diagram partially showing a refresh control circuit of a dynamic RAM.
Figure 2A:
FIGS. 2A to 2C are timing charts for explaining the operation of the circuit shown in FIG. 1.
Figure 2B:
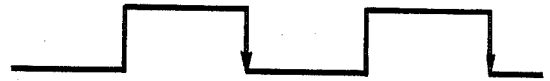
Figure 2C:
Figure 3:
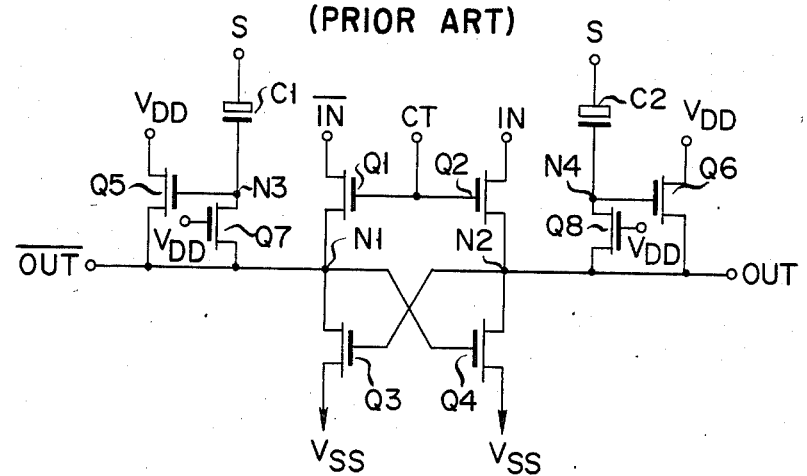
FIG. 3 is a circuit diagram of a conventional flip-flop circuit for constituting a counter in the circuit shown in FIG. 1.
Figure 4:
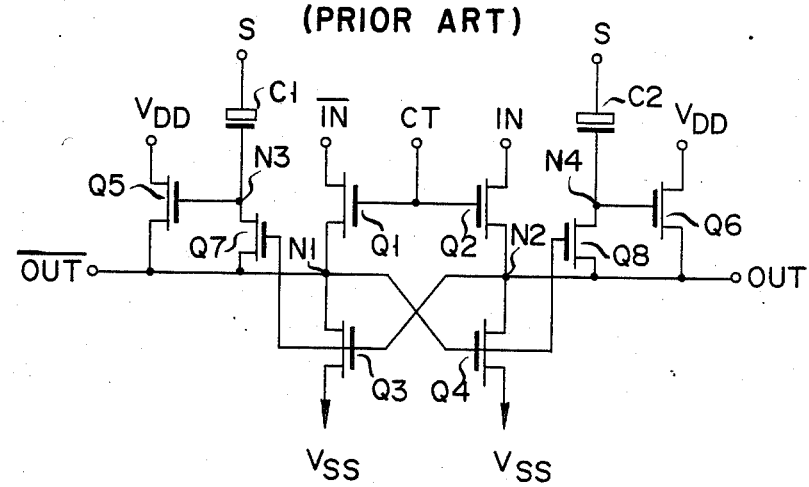
FIG. 4 is a circuit diagram of a conventional flip-flop circuit similar to that shown in FIG. 3.

In a test, the potential of output terminal OUT was measured when the potential was greatly decreased to about 3.5 V, as shown in FIG. 7. In the flip-flop circuit of this embodiment, the potential of output terminal OUT could be recovered to 5 V after a lapse of about 1.0 μs. The conventional flip-flop circuit shown in FIG. 3 could not recover the potential of output terminal OUT to 5 V after this lapse of the time, as indicated by the broken curve in FIG. 7.

With this embodiment as described above, immediately after the power source is turned on, the potential of output terminal OUT is changed from the VSS to VDD level and output terminal $\overline{\text{OUT}}$ is kept at the VSS level. Therefore, the flip-flop circuit of this embodiment can generate predetermined output signals from output terminals OUT and $\overline{\text{OUT}}$ immediately after the power source is turned on. When output terminals OUT and $\overline{\text{OUT}}$ are preset to the VSS and VDD levels, respectively, MOS capacitor C3 is of a depletion type, and MOS capacitor C4 is of an enhancement type. Since the flip-flop circuit of this embodiment is formed as a part of a counter of a dynamic RAM, the structure of the counter can be simplified by the preset function of this flip-flop circuit. This counter must generate predetermined output signals immediately after the power source is turned on. However, if the flip-flop circuit has a conventional structure, a separate circuit for initializing the output signal of the counter is necessary. However, with the flip-flop circuit of this embodiment, the counter requires no such circuit.

The flip-flop circuit of this embodiment has an excellent output voltage stabilization function. More specifically, the flip-flop circuit can recover the potential drops regardless of a decrease in potential of output terminal OUT or $\overline{\text{OUT}}$. For example, when the potential of output terminal OUT is decreased from the VDD level to a level lower than the (VDD−VTH) level due to the load, this potential can be recovered to the VDD level. MOS transistor Q9 detects the potential drop of node N3 from the potential difference between nodes N1 and N2, and charges node N3 (or the gate of MOS transistor Q5). On the other hand, MOS transistor Q10 detects the potential drop of node N4 from the potential difference between nodes N2 and N4, and charges node N4 (or the gate of MOS transistor Q6). For this reason, if the potentials of nodes N3 and N4 are decreased by current leakage, nodes N3 and N4 can still be sufficiently charged. Since MOS transistors Q9 and Q10 are connected to form diodes, nodes N3 and N4 cannot be discharged through the MOS transistors Q9 and Q10 when the respective nodes N1 and N2 are charged.

What is claimed is:

1. A flip-flop circuit comprising:
a first power terminal set at a potential of a first level;
first and second output terminals;
latching means for charging one of said first and second output terminals to a potential of the first level and discharging the other one of said first and second output terminals to a potential of a second level lower than the first level, thereby latching an input signal; and
a first potential compensation means for compensating a potential drop of said first output terminal, said potential compensation means including:
a first pull-up transistor having an insulated gate and a current path connected between said power and first output terminal, a first charging means for charging said insulated gate while the potential of said second output terminal is changed from the first level to the second level, a first bootstrap means for bootstrapping the potential of said insulated gate to turn on said pull-up transistor, and a first diode means, connected in the forward direction from said first output terminal to said insulated gate, for charging said insulated gate when the potential of said insulated gate is dropped by at least a predetermined level in comparison with that of said first output terminal.

2. A flip-flop circuit according to claim 1, wherein said diode means includes an n-channel MOS transistor having a gate connected to said first output terminal and a current path connected between said first output terminal and insulated gate.

3. A flip-flop circuit according to claim 2, wherein said charging means includes an n-channel MOS transistor having a gate connected to said second output terminal and a current path connected between the insulated gate of said pull-up transistor and said first output terminal.

4. A flip-flop circuit according to claim 3, wherein said a first bootstrap means includes a pulse input terminal to which a voltage pulse is periodically applied, and a first capacitive means connected between said pulse input terminal and the insulated gate of said pull-up transistor.

5. A flip-flop circuit according to claim 4, wherein said pull-up transistor is an n-channel MOS transistor.

6. A flip-flop circuit according to claim 5, which further comprises a second power terminal set at a potential of the second level, and in which said latching means includes: first and second input terminals selectively and complementarily set at potentials of the first and second levels, a control terminal for receiving an enable signal, first and second switching means respectively connected between said first input and first output terminals and between said second input and second output terminals and to be rendered conductive upon receipt of said enable signal, third switching means connected between said first output and second power terminals and to be rendered conductive when said second output terminal is charged, and fourth switching means connected between said second output and second power terminals and to be rendered conductive when said first output terminal is charged.

7. A flip-flop circuit according to claim 6, wherein said first and second switching means are n-channel MOS transistors each having a gate connected to said control terminal, said third switching means is an n-channel MOS transistor having a gate connected to said second output terminal, and said fourth switching means is an n-channel MOS transistor having a gate connected to said first output terminal.

8. A flip-flop circuit according to claim 7., further comprising second potential compensation means for compensating a potential drop of said second output terminal, including: a second pull-up transistor having an insulated gate and a current path connected between the first power and second output terminals, second charging means for charging the insulated gate of said second pull-up transistor while the potential of said first output terminal is changed from the first level to the second level, second bootstrap means for bootstrapping the potential of the insulated gate of said second pull-up transistor, and second diode means connected in the forward direction from said second output terminal to the insulated gate of said second pull-up transistor, for charging the insulated gate of said second pull-up transistor when the potential of the insulated gate of said second pull-up transistor is dropped by at least a predetermined level in comparison with that of said second output terminal.

9. A flip-flop circuit according to claim 8, wherein said second bootstrap means includes a second pulse input terminal and to which the voltage pulse is periodically applied, and second capacitive means connected between said second pulse input terminal and the insulated gate of said second pull-up transistor.

10. A flip-flop circuit according to claim 9, wherein said first capacitive means is a depletion type MOS capacitor and said second capacitive means is an enhancement type MOS capacitor.

11. A flip-flop circuit according to claim 10, wherein said second diode means includes an n-channel MOS transistor having a gate connected to said second output terminal and a current path connected between said second output terminal and the insulated gate of said second pull-up transistor.

12. A flip-flop circuit according to claim 11, wherein said second charging means includes an n-channel MOS transistor having a gate connected to said first output terminal and a current path connected between the insulated gate of said second pull-up transistor and said second output terminal.

13. A flip-flop circuit according to claim 12, wherein said second pull-up transistor is an n-channel MOS transistor.

14. A flip-flop circuit according to claim 1, further comprising second potential compensation means for compensating a potential drop of said second output terminal and including: a second pull-up transistor having an insulated gate and a current path connected between the first power and second output terminals, second charging means for charging the insulated gate of said second pull-up transistor while the potential of said first output terminal is changed from the first level to the second level, second bootstrap means for bootstrapping the potential of the insulated gate of said second pull-up transistor, and second diode means, connected in the forward direction from said second output terminal to the insulated gate of said second pull-up transistor, for charging the insulated gate of said second pull-up transistor when the potential of the insulated gate of said second pull-up transistor is dropped by at least a predetermined level in comparison with that of said second output terminal.

15. A flip-flop circuit comprising:
a power terminal set at a potential of a first level;
first and second output terminals;
latching means for charging one of said first and second output terminals to a potential of the first level and discharging the other one of said first and second output terminals to a potential of a second level lower than the first level, thereby latching an input signal;
a pulse input terminal to which a voltage pulse is periodically applied;
a first pull-up transistor having an insulated gate and a current path connected between said power and first output terminals;
a second pull-up transistor having an insulated gate and a current path connected between said power and second output terminals;
a depletion type MOS capacitor connected between said pulse input terminal and the insulated gate of said first pull-up transistor;
an enhancement type MOS capacitor connected between said pulse input terminal and the insulated gate of said second pull-up transistor; and
a first discharge means for discharging said second output terminal when said first output terminal is charged.

16. A flip-flop circuit according to claim 15, further comprising a second discharge means for discharging the insulated gate of said second pull-up transistor when said first output terminal is charged.

* * * * *